United States Patent [19]
Mittel

[11] Patent Number: 5,093,642
[45] Date of Patent: Mar. 3, 1992

[54] SOLID STATE MUTUALLY COUPLED INDUCTOR

[75] Inventor: James G. Mittel, Boynton Beach, Fla.

[73] Assignee: Motorola, Inc., Schaumburg, Ill.

[21] Appl. No.: 532,785

[22] Filed: Jun. 4, 1990

[51] Int. Cl.$^5$ .................................. H03H 11/50
[52] U.S. Cl. .................................................. 333/215
[58] Field of Search ...................... 333/213, 214, 215

[56] References Cited

U.S. PATENT DOCUMENTS

| | | | |
|---|---|---|---|
| 3,001,157 | 9/1961 | Sipress et al. | 333/215 |
| 3,713,050 | 1/1973 | Golembeski | 333/215 X |
| 4,381,489 | 4/1983 | Canning et al. | 333/215 |

OTHER PUBLICATIONS

Duvalsaint et al., Gyrator Connection for Transformer Operation, IBM Tech. Discl. Bulletin, vol. 18, No. 10, Mar. 1976, pp. 3371, 3372.

Primary Examiner—Paul Gensler
Attorney, Agent, or Firm—William E. Koch; Vincent B. Ingrassia

[57] ABSTRACT

An electrical circuit (200) comprises a first circuit (208) constructed and arranged to simulate an inductor and a second circuit (210) constructed and arranged to simulate an inductor. Coupled to these circuits is a third circuit (212) for simulating a mutual inductance therebetween.

7 Claims, 2 Drawing Sheets

SOLID STATE MUTUALLY COUPLED INDUCTOR

FIELD OF THE INVENTION

This invention relates in general to mutually coupled inductors and more specifically to an inductance simulating electrical circuit further simulating a mutual inductance therebetween.

BACKGROUND OF THE INVENTION

The trend in electronics has been to reduce the size of circuits; a trend that culminated in the development of integrated circuits. While it is relatively simple to greatly reduce the dimensions of resistors and capacitors, unfortunately, it remains impractical to achieve a comparable reduction in the sizes of inductors. Accordingly, active elements (e.g., operational amplifiers or transconductance amplifiers configured to simulate inductive reactance) are often used as a substitute for inductors since they can be arranged to closely simulate an inductor's performance.

Many filter topologies require the use of coupled tuned circuits. For those designs that require response symmetry, some form of inductive coupling must be used. Regrettably, inductors formed from looped or coiled wires require a high number of turns to achieve the appropriate circuit response. Therefore to use such inductors human operators are required to tune each circuit for an appropriate response. Such an undertaking is very time consuming and costly to the consumers. Additionally, wire-wound inductors often lose their tuned response with age, and as a consequence, these inductors have to be re-tuned to achieve the required circuit response. Finally, the large sizes and the decaying performance with age of the wire-wound inductors make them undesirable for use in filters.

In a solid state filter embodiment, capacitive coupling is typically used when the application is not sensitive to the symmetry of the filter's response. When inductive elements are needed, they are typically implemented via known active circuit elements configured to simulate inductors. Like most integrated circuits, solid state inductive filters do not require constant re-tuning to maintain efficient operation. Regrettably, however, solid state circuit simulation of mutually coupled inductive circuits has been heretofore unavailable. This has limited the use of solid state filters in those applications that require mutual coupling. Accordingly, a need exists for electronically simulated mutually inductive coupling.

SUMMARY OF THE INVENTION

Briefly, according to the invention, an electrical circuit comprises a first circuit constructed and arranged to simulate an inductor, and a second circuit also constructed and arranged to simulate a second inductor. Coupled to both these inductive simulating circuits is a feedback circuit providing a simulated mutual inductance therebetween.

DESCRIPTION OF A PREFERRED EMBODIMENT

Figure 1:
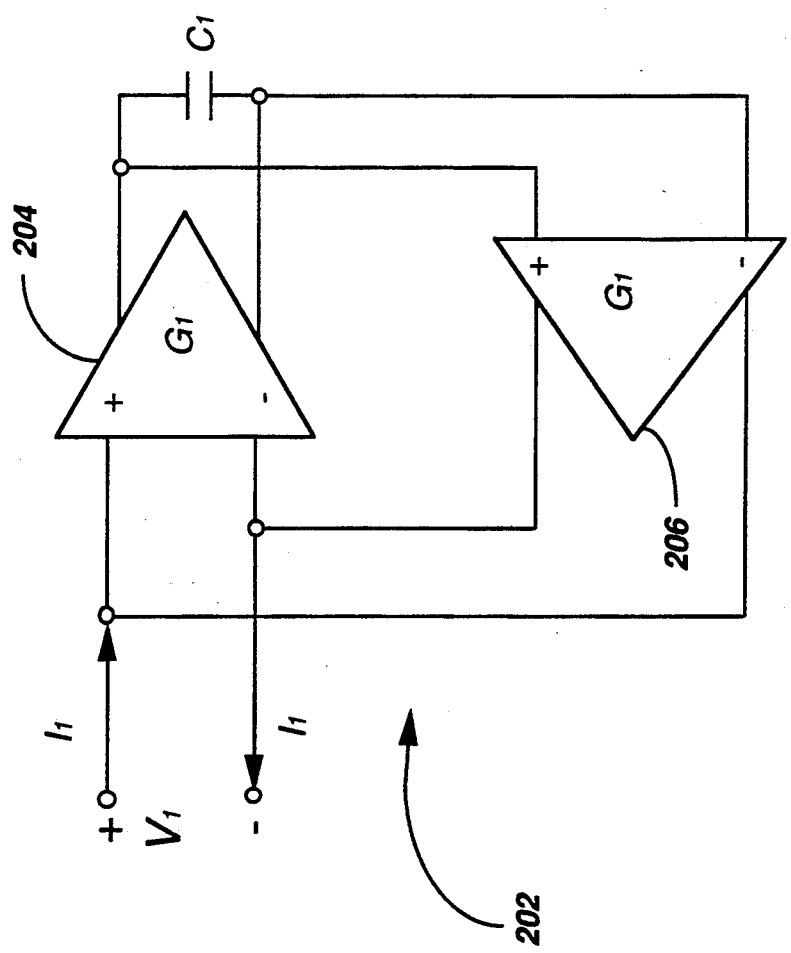
FIG. 1 is a block diagram of a known configuration for simulating an inductor.

Referring to FIG. 1, a well known circuit configuration receives an input voltage $V_1$ at input terminals of an amplifier 204. This voltage is converted to a current and is driven into a capacitor $C_1$ by the amplifier 204. Preferably, the amplifiers 204 and 206 comprise transconductance amplifiers having a conductance G1. Well known relationships show that the voltage developed across the capacitor $C_1$ is related to the integral of the input voltage $V_1$. Operationally, the amplifier 206 senses the voltage developed across capacitor $C_1$ and forces the input current $I_1$ of the circuit 202 to be substantially equal to the voltage developed across the capacitor $C_1$. Thus, since the capacitor $C_1$ integrates the input voltage $V_1$, and since the input current is forced to be the integral of the input voltage $V_1$ the circuit 202 simulates an inductor.

Figure 2:
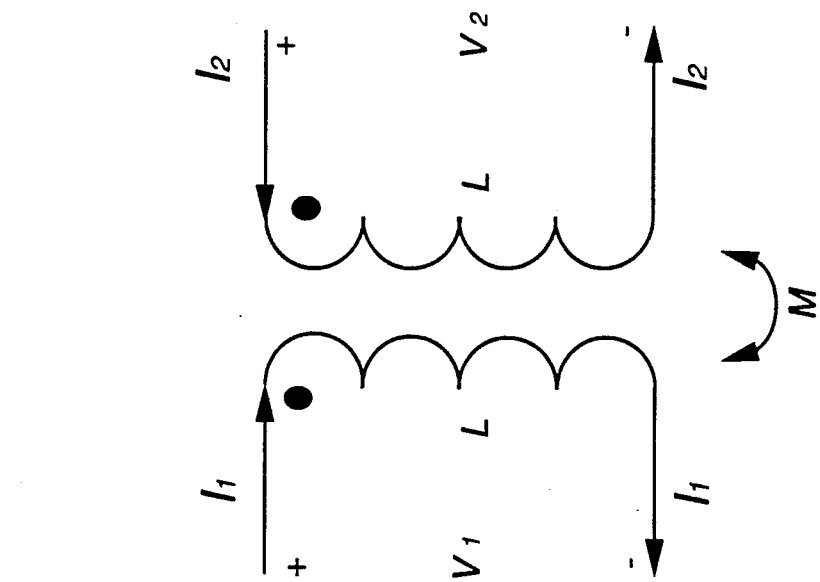
FIG. 2 is an illustration of mutual conductive coupling between inductors.

Those skilled in the art will appreciate that the transformer circuit shown in FIG. 2 comprises a mutually coupled inductive circuit having mutual inductance:

$$M = KL \tag{1}$$

The mutual inductive coupling M being given as the product of the coupling coefficient K and the inductance L of the windings. Those skilled in the art will appreciate that the voltage $V_1$ applied across the first winding is given as:

$$V_1 = SLI_1 + SMI_2 \tag{2}$$

where:
S represents the frequency-domain complex variable;
L is the inductance;
$I_1$ is the current through the first winding;
$I_2$ is the current through the second winding; and
M represents the mutual inductances between both windings.

A similar relationship for the voltage $V_2$ across the second windings is also known and may be given as a function of the current through both winding as:

$$V_2 = SLI_2 + SMI_1 \tag{3}$$

Combining equations (2) and (3) and solving for $I_1$ provides:

$$I_1 = 1/S(V_1L - MV_2)/(LL - MM) \tag{4}$$

As will be appreciated from equation (4), the numerator comprises the product of voltage $V_1$ applied across the first winding L minus the product of the voltage $V_2$ across the second winding and the mutual inductance M therebetween.

Similarly, combining equations (2) and (3) and solving for $I_2$ provides:

$$I_2 = 1/S(V_2L - MV_1)/(LL - MM) \tag{5}$$

Thus, electronic simulation of mutually coupled inductors may be achieved if circuits satisfying equations (4) and (5) may be arranged, preferable in a solid state implementation.

Figure 3:
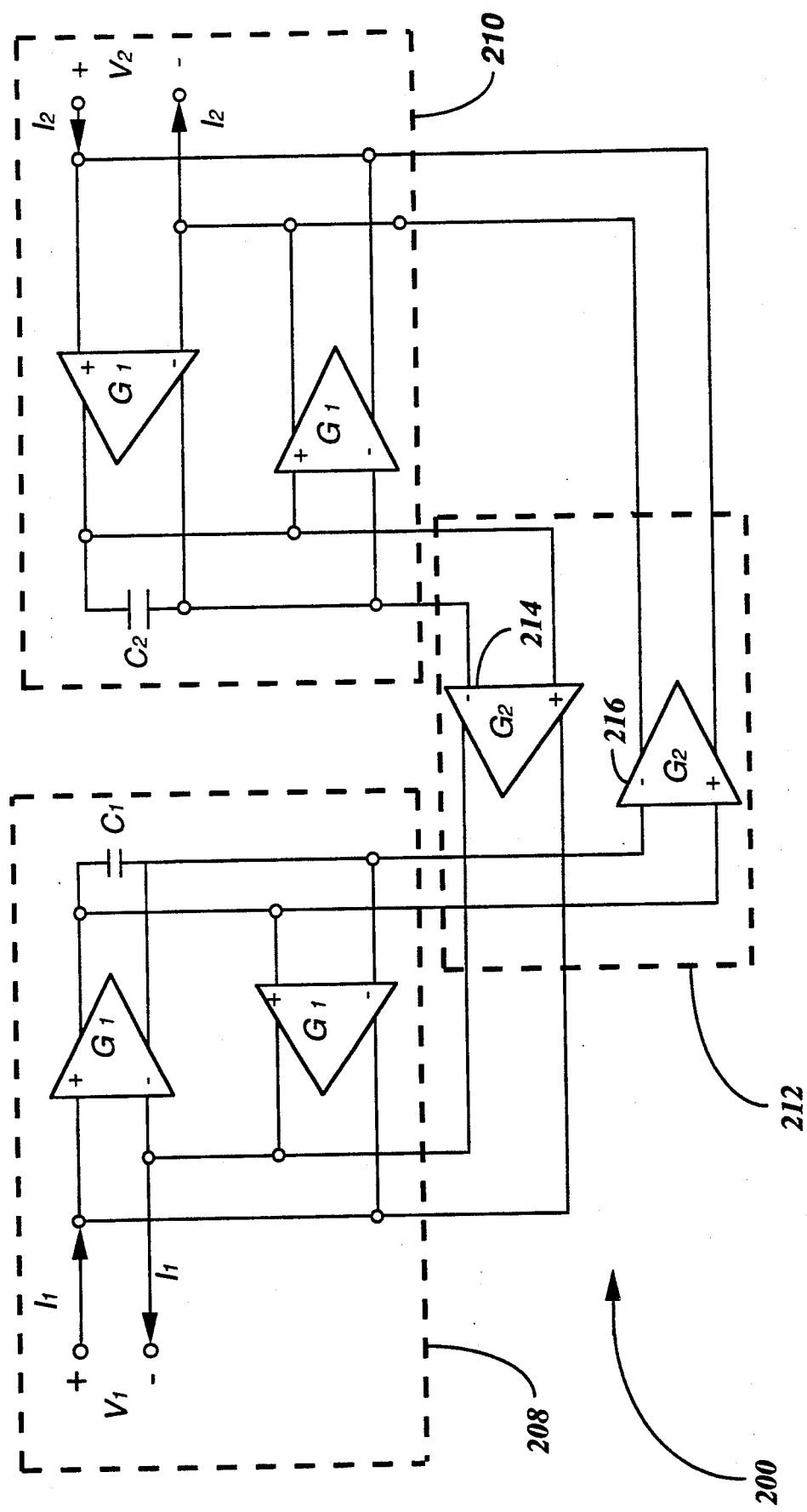
FIG. 3 is a block diagram in accordance with an embodiment of the present invention.

Referring to FIG. 3, two simulated inductors 208, 210 are shown and both circuits will be appreciated to operate similarly to the circuit 202 shown in FIG. 1. Operationally, a first voltage $V_1$ is applied across the terminals of the first circuit 208, and second voltage $V_2$ is applied across the terminals of the second circuit 210. Connected between the first and second circuits is a third circuit preferably comprising a pair of transconductance amplifiers 214 and 216. The amplifiers 214 and 216 provide a feedback arrangement between the inductor simulators 208 and 210. According to the invention, this feedback arrangement simulates a mutual coupling between circuits 208 and 210. To do this, the transconductance amplifier 214 senses the voltage across capacitor $C_2$ and provides it to the input of circuit 208. Similarly, transconductance amplifier 216 senses the voltage across capacitor $C_1$ and provides it to the input of the circuit 210. Applying a well known differential equation to the arrangement of FIG. 3 shows that the input current comprises the integral of the voltage applied across each inductor simulator (208 and 210) minus a term that is related to the voltage on the input terminal (210 and 208, respectively). As will be appreciated, this minus function is achieved by reversing the polarity of the amplifiers 214 and 216. Thus, the circuit of FIG. 3 yields:

$$I_1(t) = \int \frac{(V_1(t)L_1 - MV_2(t))dt}{LL - MM} \quad (6)$$

From equation (6), the mutual conductance M may be solved for as:

$$M = (G_2/G_1)L \quad (7)$$

where the mutual inductance M is given by the product of the inductance L and ratio of the conductances $G_1$ and $G_2$ of the inductor simulators 208 and 210 and the feedback circuit 212.

Solving for the inductance L of circuits elements 208 and 210 from equation (7) provides:

$$L = C/(G_1G_1 - G_2G_2) \quad (8)$$

where the capacitance of the capacitor is given as C, the conductance of the amplifiers of circuit 208 and 210 is given as $G_1$, and the conductance of the amplifiers of the feedback circuit 214 is given as $G_2$.

Therefore, applying equations (7) and (8) to equation (6), current $I_1$ through circuit 208 is given as:

$$I_1 = 1/S(G_1G_1V_1 - G_1G_2V_2)/C \quad (9)$$

and the current $I_2$ through circuit 210 is given as:

$$I_2 = 1/S(G_1G_1V_2 - G_1G_2V_1)/C \quad (10)$$

Comparing equations (4) and (5) with equations (9) and (10) proves that the circuit of FIG. 3 simulates not only two inductors (208 and 210), but additionally simulates the mutual inductance therebetween. Moreover, this mutual inductance may be controlled by appropriate selection of the amplifier transconductance values G1 and G2. Finally, electronic tuning of the inductance is readily achieved by simply varying a bias current (not shown) which in turn varies the conductance of both inductors (208 and 210) via any known technique.

In summary, the invention includes two known active inductors which are coupled via a feedback circuit to simulate mutual conductive coupling. Using the feedback circuits of the present invention similar mutual coupling between the inductors of FIG. 3 can be achieved as in the transformer circuit shown in FIG. 2. This configuration enables the inductors to be embodied in a solid state filter that can be dynamically tuned without being subjected to undue shifts in frequency response due to aging of the device. From equations (9) and (10), it will be appreciated that dynamic tuning of the inductance provided by FIG. 3 may be accomplished by simply varying a bias current (not shown) which in turn varies the conductance of the inductors (208 and 210) via any known technique.

I claim:

1. An electrical circuit for emulating mutually coupled inductors comprising:
   a first circuit having a first input and a first output constructed and arranged to simulate a first inductor;
   a second circuit having a second input and a second output constructed and arranged to simulate a second inductor; and
   coupling means for simulating a mutual inductance between the first and second circuits, said coupling means coupled to the second circuit to sense the second output and derive therefrom a first signal for providing to the first input and coupled to the first circuit to sense the first output and derive therefrom a second signal for providing to the second input.

2. An electrical circuit according to claim 1 wherein the first circuit comprises at least one transconductance amplifier for simulating the first inductor.

3. An electrical circuit according to claim 1 wherein the second circuit comprises at least one transconductance amplifier for simulating the second inductor.

4. An electrical circuit according to claim 1 wherein the transconductance of the first circuit is equal to the transconductance of the second circuit.

5. An electrical circuit according to claim 1 wherein a third circuit comprises the coupling means having at least two transconductance amplifiers.

6. An electrical circuit according to claim 5 wherein the ratio of the inductance of the first circuit and the inductance of the third circuit may be controlled dynamically.

7. An electrical circuit according to claim 5 wherein the ratio of the inductance of the second circuit and the inductance of the third circuit may be controlled dynamically.

* * * * *